(12) United States Patent
Hattori et al.

(10) Patent No.: US 9,662,730 B2
(45) Date of Patent: May 30, 2017

(54) BUMP ELECTRODE, BOARD WHICH HAS BUMP ELECTRODES, AND METHOD FOR MANUFACTURING THE BOARD

(71) Applicant: Senju Metal Industry Co., Ltd., Tokyo (JP)

(72) Inventors: Takahiro Hattori, Tochigi (JP); Daisuke Soma, Tochigi (JP); Isamu Sato, Saitama (JP)

(73) Assignee: Senju Metal Industry Co., Ltd., Tokyo (JP)

( * ) Notice: Subject to any disclaimer, the term of this patent is extended or adjusted under 35 U.S.C. 154(b) by 0 days.

(21) Appl. No.: 14/475,249

(22) Filed: Sep. 2, 2014

(65) Prior Publication Data

US 2015/0061129 A1  Mar. 5, 2015

(30) Foreign Application Priority Data

Sep. 3, 2013  (JP) ................. 2013-182296

(51) Int. Cl.
*H01L 23/00* (2006.01)
*B23K 1/20* (2006.01)
(Continued)

(52) U.S. Cl.
CPC ............... *B23K 1/203* (2013.01); *B23K 1/20* (2013.01); *H01L 21/4853* (2013.01); *H01L 23/49816* (2013.01); *H01L 24/11* (2013.01); *H01L 24/13* (2013.01); *H05K 3/3436* (2013.01); *B23K 1/0016* (2013.01); *H01L 2224/03828* (2013.01);
(Continued)

(58) Field of Classification Search
CPC . H01L 24/14; H01L 24/81; H01L 2224/1405; H01L 2224/1401; H01L 2224/81815; H01L 2224/81024; H01L 2224/81051; B23K 1/20; B23K 1/203
See application file for complete search history.

(56) References Cited

U.S. PATENT DOCUMENTS

| 6,324,754 | B1 * | 12/2001 | DiStefano | ......... H01L 23/49838 228/180.22 |
| 7,053,491 | B2 * | 5/2006 | Martin | ............... H01L 21/4853 257/730 |
| 7,265,046 | B2 * | 9/2007 | Kondo | .............. H01L 23/49816 257/E21.476 |

FOREIGN PATENT DOCUMENTS

| CN | 1633513 A | 6/2005 |
| JP | 07-183652 | 7/1995 |

(Continued)

OTHER PUBLICATIONS

Machine English Translation of JP 03-006891, Ozawa Takashi, published Jan. 14, 1991.*

(Continued)

*Primary Examiner* — Peniel M Gumedzoe
(74) *Attorney, Agent, or Firm* — Chernoff, Vilhauer, McClung & Stenzel, LLP

(57) ABSTRACT

A bump electrode is formed on an electrode pad using a Cu core ball in which a core material is covered with solder plating, and a board which has bump electrodes such as semiconductor chip or printed circuit board mounts such a bump electrode. Flux is coated on a substrate and the bump electrodes are then mounted on the electrode pad. In a step of heating the electrode pad and the Cu core ball to melt the solder plating, a heating rate of the substrate is set to have not less than 0.01° C./sec and less than 0.3.

2 Claims, 14 Drawing Sheets

(51) Int. Cl.
  *H01L 23/498* (2006.01)
  *H01L 21/48* (2006.01)
  *H05K 3/34* (2006.01)
  *B23K 1/00* (2006.01)

(52) U.S. Cl.
  CPC ............ *H01L 2224/1112* (2013.01); *H01L 2224/11334* (2013.01); *H01L 2224/11849* (2013.01); *H01L 2224/136* (2013.01); *H01L 2224/1312* (2013.01); *H01L 2224/1316* (2013.01); *H01L 2224/1317* (2013.01); *H01L 2224/1318* (2013.01); *H01L 2224/1319* (2013.01); *H01L 2224/1362* (2013.01); *H01L 2224/1366* (2013.01); *H01L 2224/13109* (2013.01); *H01L 2224/13111* (2013.01); *H01L 2224/13113* (2013.01); *H01L 2224/13116* (2013.01); *H01L 2224/13117* (2013.01); *H01L 2224/13118* (2013.01); *H01L 2224/13123* (2013.01); *H01L 2224/13124* (2013.01); *H01L 2224/13138* (2013.01); *H01L 2224/13139* (2013.01); *H01L 2224/13144* (2013.01); *H01L 2224/13147* (2013.01); *H01L 2224/13149* (2013.01); *H01L 2224/13155* (2013.01); *H01L 2224/13157* (2013.01); *H01L 2224/13164* (2013.01); *H01L 2224/13166* (2013.01); *H01L 2224/13169* (2013.01); *H01L 2224/13171* (2013.01); *H01L 2224/13179* (2013.01); *H01L 2224/13582* (2013.01); *H01L 2224/13605* (2013.01); *H01L 2224/13609* (2013.01); *H01L 2224/13611* (2013.01); *H01L 2224/13613* (2013.01); *H01L 2224/13616* (2013.01); *H01L 2224/13617* (2013.01); *H01L 2224/13618* (2013.01); *H01L 2224/13624* (2013.01); *H01L 2224/13638* (2013.01); *H01L 2224/13639* (2013.01); *H01L 2224/13647* (2013.01); *H01L 2224/13655* (2013.01); *H01L 2224/13657* (2013.01); *H01L 2224/13671* (2013.01); *H01L 2924/3651* (2013.01); *H01L 2924/384* (2013.01); *H05K 2201/10234* (2013.01); *H05K 2201/10621* (2013.01); *H05K 2201/10734* (2013.01); *H05K 2203/041* (2013.01); *Y02P 70/613* (2015.11)

(56) References Cited

FOREIGN PATENT DOCUMENTS

| | | |
|---|---|---|
| JP | 2006344624 | 12/2006 |
| WO | 2006126527 A1 | 11/2006 |

OTHER PUBLICATIONS

The State Intellectual Property Office of P.R. China, Notification of First Office Action in Application No. 201410446263.5, Aug. 23, 2016, 7 pages, Beijing, China (translation included).

\* cited by examiner

FIG.5

| RATE OF TEMPERATURE INCREASE [°C/sec] | | | | RATE OF TEMPERATURE DECREASE [°C/sec] | | OXYGEN CONTENT | FLUX |
|---|---|---|---|---|---|---|---|
| 30°C~210°C | 210°C~230°C | | 230°C~245°C | 245°C~180°C | | | |
| 2.00 | EMBODIMENT1 | 0.10 | 2.00 | 2.00 | | 100ppm OR LESS | WF-6450 |
| | EMBODIMENT2 | 0.20 | | | | | |
| | COMPARISION EXAMPLE1 | 0.30 | | | | | |
| | COMPARISION EXAMPLE2 | 2.00 | | | | | |

FIG.7B

| RATE OF TEMPERATURE INCREASE [°C/sec] | | DISTANCE BETWEEN THE CENTER OF Cu CORE BUMP AND THAT OF SOLDER RESIST [μm] |
|---|---|---|
| 210°C~230°C | | |
| EMBODIMENT1 | 0.10 | 4.4 |
| EMBODIMENT2 | 0.20 | 6.3 |
| COMPARISION EXAMPLE1 | 0.30 | 15.0 |
| COMPARISION EXAMPLE2 | 2.00 | 14.8 |

FIG.9

| RATE OF TEMPERATURE INCREASE [°C/sec] | | | | RATE OF TEMPERATURE DECREASE [°C/sec] | OXYGEN CONTENT | FLUX |
|---|---|---|---|---|---|---|
| 30°C~215°C | 215°C~228°C | 228°C~245°C | | 245°C~180°C | | |
| 2.00 | EMBODIMENT3 | 0.01 | 2.00 | 2.00 | 100ppm OR LESS | WF −6450 |
| | EMBODIMENT4 | 0.05 | | | | |
| | EMBODIMENT5 | 0.10 | | | | |
| | EMBODIMENT6 | 0.13 | | | | |
| | EMBODIMENT7 | 0.15 | | | | |
| | EMBODIMENT8 | 0.20 | | | | |
| | COMPARISION EXAMPLE3 | 2.00 | | | | |

FIG.11B

| RATE OF TEMPERATURE INCREASE [°C/sec] 215°C~228°C | | DISTANCE BETWEEN THE CENTER OF Cu CORE BUMP AND THAT OF SOLDER RESIST [μm] |
|---|---|---|
| EMBODIMENT3 | 0.01 | 2.5 |
| EMBODIMENT4 | 0.05 | 3.9 |
| EMBODIMENT5 | 0.10 | 3.6 |
| EMBODIMENT6 | 0.13 | 4.0 |
| EMBODIMENT7 | 0.15 | 6.8 |
| EMBODIMENT8 | 0.20 | 7.3 |
| COMPARISION EXAMPLE3 | 2.00 | 14.8 | ical equipment such as a
BUMP ELECTRODE, BOARD WHICH HAS BUMP ELECTRODES, AND METHOD FOR MANUFACTURING THE BOARD

CROSS REFERENCE TO RELATED APPLICATION

The present invention contains subject matter related to Japanese Patent Application No. 2013-182296 filed in the Japanese Patent Office on Sep. 3, 2013, the entire contents of which being incorporated herein by reference.

BACKGROUND OF THE INVENTION

Field of the Invention

The present invention relates to a bump electrode, a board which has bump electrodes and a method for manufacturing the board. It particularly relates to a bump electrode formed by using a solder joint in which a core material that becomes a core is covered with solder plating, a board such as semiconductor chip or printed circuit board which has bump electrodes (hereinafter, referred to as "board which has bump electrodes), and the method for manufacturing the board.

Description of Related Art

Recently, a rapid downsizing of electronic components to be mounted on small sized information equipment such as a smart phone has been required because of a development of the small sized information equipment. On such electronic components, ball grid array (hereinafter, referred to as "BGA") in which an array of small ball electrodes is arranged on a plane resin-made package is applied because of a narrowed connection terminal based on the requirement of the downsizing, a fine pitch between the electrodes and/or a reduction of mounting area.

As electronic components on which BGA is applied, the semiconductor package such as central processing unit (CPU) is represented. In the semiconductor package, a semiconductor chip having plural electrodes is sealed with resin. For each electrode in the semiconductor chip, a solder bump is formed. Such a solder bump is formed by joining a solder ball made by forming a solder like a ball with an electrode of the semiconductor chip.

The semiconductor package on which BGA is applied is mounted on a printed circuit board by joining the solder bump melted by heating with a conductive land (electrode pad) of the printed circuit board.

Any three-dimensional layered structures in each of which the semiconductor packages are stacked in height direction thereof have been developed, to cope with a requirement of further high density mounting. However, when BGA is applied on the semiconductor packages having such a three-dimensional layered structure, the solder ball may be crushed by the upper semiconductor-package's weight. The crushed solder ball may be pushed out of an electrode of connecting terminal and such an electrode may be connected with adjacent electrode to be short-circuited.

Accordingly, a bump electrode as the electrode for electronic components has been used. The bump electrode is referred to as an electrode that is made by using a Cu core ball in which a core material, for example, Cu ball that becomes a core is covered with plated Ni and the Ni-plated core material is then covered with solder plating. The bump electrodes each made by using the core material can support the upper semiconductor package by Cu balls which are not melted at a melting point of the solder even if weight of the upper semiconductor package is applied to the bump electrodes when mounting the electronic components on the printed circuit board. Thus, the bump electrodes are not crushed by the weight of the upper semiconductor package.

On the other hand, in the past, a reflow furnace has been used when soldering the electronic components on predetermined positions of the printed circuit board. Flux or solder paste has been used when forming the bump electrodes in the reflow furnace. The solder paste is made by stirring solder powder with flux. The flux, solder paste or the like is applied on plural electrode pads formed on a substrate, on which a metal mask is aligned and a squeegee is slid on the metal mask, through plural holes formed in the metal mask. The other applying method of the flux, solder paste or the like than that of directly applying them on the electrode pads using the metal mask can be adopted. For example, their applying methods include a ball transfer method, a pin transfer method, a dispense method and a splay method.

The flux removes any oxide film from a metal surface to be soldered and prevents the metal surface from being again oxidized during a period of heating time in a soldering step. The flux has an action of reducing surface tension of the solder and improving wettability thereof. The flux is a solution made by melting solid contents of rosin, thixotropic agent, activator or the like using a solvent.

Japanese Patent Application Publication No. 2006-344624 discloses a method of manufacturing an electronic component. This method includes arranging Cu-cored solder ball having a diameter of 0.01 mm through 1 mm on an electrode pad and heating to join them to obtain an electrode that becomes a connecting terminal.

When this Cu-cored solder ball also has a relation of $0.05 \leq (Vs/Vc) \leq 0.5$ wherein Vc is volume of the Cu-cored solder ball and Vs is volume of plated layer and this electrode pad has a relation of $0.5 \leq (Dp/Dc0) \leq 1.0$ wherein Dp is a diameter of the electrode pad and Dc is a diameter of the Cu-cored solder ball, the core is positioned at a center of the electrode pad.

SUMMARY OF THE INVENTION

When soldering the Cu core ball on the electrode pad in the reflow furnace, a Cu ball as the core material that becomes the core may be joined with the Cu ball being shifted from a center of the electrode pad to a biased position (eccentricity). The eccentricity of Cu ball results in very thin layer portion of the solder, which may lead to an occurrence of non-joining based on an exposure of inter metallic compound (hereinafter, referred to as "IMC") in a secondary mounting. When the Cu ball is out of the electrode pad and stays on the substrate, it is difficult to keep an interval between the semiconductor packages (substrates) constant.

When soldering the Cu ball according to the method disclosed in Japanese Patent Application Publication No. 2006-344624 based on the relations of $0.05 \leq Vs/Vc \leq 0.5$ and $0.5 \leq Dp/Dc \leq 1.0$, it is considered that a center of the Cu ball aligns a center of a shell of the solder. However, when there may be a small amount of solder under the above conditions, IMC may be exposed on a top of the solder bump after the reflow processing. This may result in an occurrence of the non-joining of solder at the secondary mounting time because there is mal-wettability between the solder and IMC. Further, when soldering the Cu ball based on any relation other than the above conditions, even if the Cu ball is soldered according to the method disclosed in Japanese Patent Application Publication No. 2006-344624, it is likely that the center of the Cu ball does not align the center of the shell of the solder. This may also result in any occurrence of the non-joining of solder and/or any uneven interval between the semiconductor packages (substrates).

This invention addresses the above-mentioned issues and has an object to provide an improved bump electrode in which a center of the core material that becomes a core can align a center of a shell of the solder covered on the core material with an excellent reproducibility on an electrode pad on a horizontal section thereof by devising a melting step of the solder plating, an improved board which has bump electrodes and an improved method for manufacturing the board.

The inventors have believed that regarding a positional shift of the center of the core material that becomes the core inside a terminal of the bump electrode, a rate of temperature increase around a solder melting point has a close relationship with an eccentricity of the core material that forms the bump electrode. They have found out that such a rate of temperature increase exhibits an eccentricity control effect on the core material at a period of heating time (reflow processing time), which will be described later, of the substrate and have accomplished this invention. Here, the eccentricity control of the core material is referred to as a control for heating the substrate to control the rate of temperature increase so that creep up rate of the flux or the flux in the solder paste from the electrode pad becomes slower and running down rate of the solder to the electrode pad becomes slower as well as the center of the core material that forms the bump electrode can align a center of the shell of the solder on the horizontal section thereof on the electrode pad.

To achieve the above-mentioned object, a bump electrode is formed on an electrode pad with a connecting member in which a core material that becomes a core is covered with solder plating. The substrate is configured so as to have a heating rate of 0.01° C./sec or more and less than 0.3° C./sec in a step of heating and melting the solder plating after the connecting member has been mounted on the electrode pad.

It is desirable to provide a board which has a bump electrode containing a substrate, an electrode pad provided on the substrate, and the above-mentioned bump electrode that is joined with the electrode pad.

It is also desirable to provide a method for manufacturing a board which has a bump electrode. The method comprises the steps of mounting a connecting member, in which a core material that becomes a core is covered with solder plating, on an electrode pad of a substrate, and heating the substrate to melt the solder plating that covers the core material, wherein a heating rate of the substrate is configured so as to be not less than 0.01° C./sec and less than 0.3° C./sec in the step of heating and melting the solder plating.

The concluding portion of this specification particularly points out and directly claims the subject matter of the present invention. However, those skilled in the art will best understand both the organization and method of operation of the invention, together with further advantages and objects thereof, by reading the remaining portions of the specification in view of the accompanying drawing(s) wherein like reference characters refer to like elements.

BRIEF DESCRIPTION OF THE DRAWINGS

FIG. 5 is a table showing a setting example of a first reflow profile;

FIG. 7B is a table showing the distribution example of the distance between the center of Cu core bump and that of solder resist against the rate of temperature increase in the first reflow profile;

FIG. 9 is a table showing a setting example of a second reflow profile;

FIG. 11B is a table showing the distribution example of the distance between the center of Cu core bump and that of solder resist against the rate of temperature increase in the second reflow profile.

DESCRIPTION OF THE PREFERRED EMBODIMENTS

The following will describe configuration examples of a bump electrode, a board which has bump electrodes and a method for manufacturing the board as preferred embodiments relating to the invention with reference to drawings.

First, the configuration examples of the bump electrode 30 and the board 100 which has bump electrodes as preferred embodiments will be described. It is to be noted that in these examples, a Cu ball is selected as a core material. This Cu ball is covered with plated Ni and the Ni-plated Cu ball is further covered with solder plating to form a Cu core ball. Flux is used for mounting the Cu core ball on the electrode.

Figure 1:
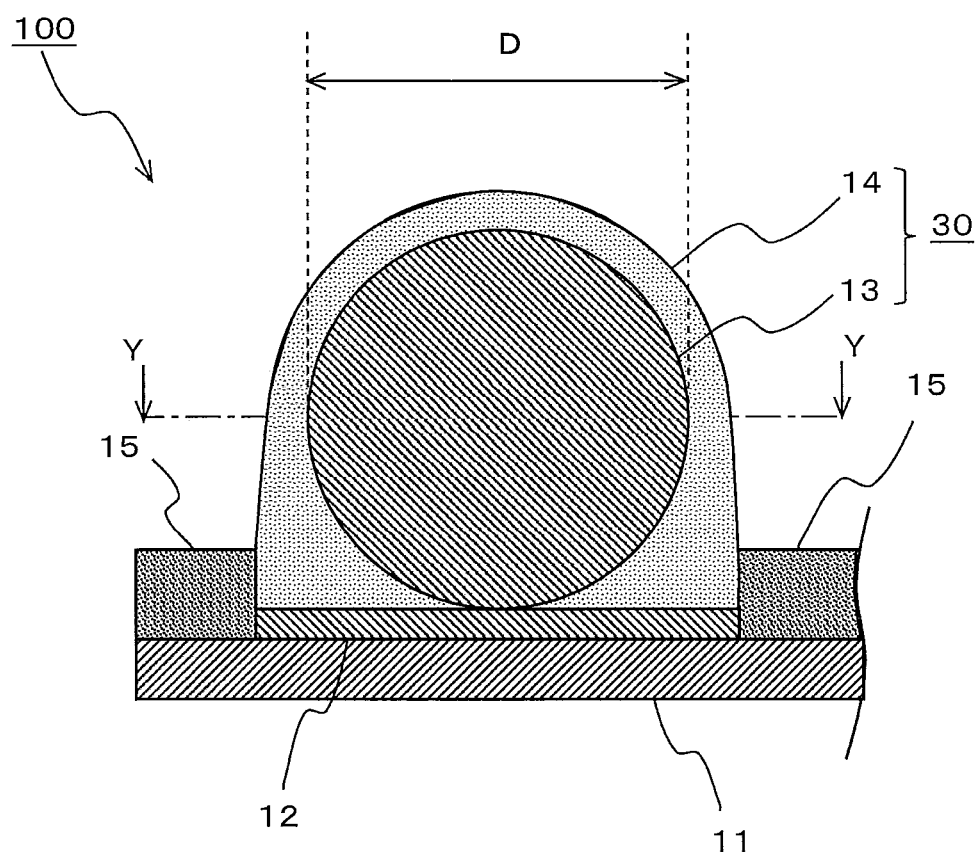
FIG. 1 is a sectional view of a board which has bump electrodes showing a configuration example of the board which has the bump electrodes according to an embodiment of this invention.

The board 100 which has bump electrodes shown in FIG. 1 contains a substrate 11, an electrode pad 12 and the bump electrode 30. The bump electrode 30 contains Cu ball 13 and the solder 14. The numeral 15 in drawings indicates an insulating film (layer). Plural electrode pads, not shown, are provided on a predetermined substrate 11 with a desired pitch. Each electrode pad has circular shape. The Cu ball 13 is one example of a core material that becomes a core. The letter D shown in the drawings indicates a diameter of the Cu ball and, for example, D is about 190 μm.

The core material that becomes the core in the bump electrode 30 includes metal alone of Cu, Ni, Ag, Bi, Pb, Al, Sn, Fe, Zn, In, Ge, Sb, Co, Mn, Au, Si, Pt, Cr, La, Mo, Nb, Pd, Ti, Zr and Mg, which have higher melting points than that of solder plating 24, their metal oxide, their mixed metal oxide or their alloy, other than the Cu ball 13.

The core material also includes any resin material that has a higher melting point than that of the solder plating 24, any carbon material or any insulating member such as ceramics. The resin material, the carbon material and the ceramics themselves do not have conductivity but the core material is covered by any metal so that even when joining any core ball including the resin material, the carbon material and the ceramics as the core on the electrode pad, the core material has conductivity between the electrodes through the covered metal without any problem. Using the insulating member as the core material allows skin effect to be effective in transferring a high-frequency signal.

The resin material as the core material includes a resin obtained by polymerizing monomer such as styrene, styrene derivative such as α-methyl styrene, p-methyl styrene, p-chlorostyrene, chloromethyl styrene and the like, polyvinyl chloride, vinyl esters such as vinyl estate, vinyl propionate and the like, unsaturated nitriles such as acrylonitrile and the like, and acrylic acid ester derivatives such as methyl(meth)acrylate, ethyl (meth)acrylate, butyl (meth) acrylate, 2-ethyl hexyl (meth)acrylate, stearyl (meth)acrylate, ethylene glycol (meth)acrylate, trifluoroethyl (meth) acrylate, pentafluoroethyl (meth)acrylate, cyclohexyl (meth) acrylate and the like. The monomer alone can be used or two types or more of the monomers can be used together with each other.

When the core material is metal, the core material may be plated with Ni, Co or the like. Plating the core material with Ni, Co or the like allows to be realized a barrier function to prevent element of the core material from being diffused to the solder plating when covering the core material with the solder plating. When the core material is an insulator such as resin, the core material can be plated with Cu before the plating with Ni, Co or the like has been completed. Plating the core material with Cu allows the Cu portion to be conductive when forming the bump electrode. To plate the core material of insulator, electroless deposition is used. It is preferred that the core material has a diameter of 1 through 1000 μm. When the core material has such a diameter, it is possible to manufacture the spherical core material stably and it is possible to control any short-circuit in a case of narrow pitch between the terminals.

A composition of the solder for plating the core material is not specifically limited. Elements for the solder composition are at least one of Sn, Ag, Cu, Bi, In, Ni, Sb, Zn, Ge, Ga, Co, Fe, P, Cr, Pb, Fe and Al and any metal or alloy having lower liquidus temperature than that of the core material is available therefor. In this moment, it is set that the composition of the core material is never identical to that of the solder alloy. Among them, alloy composition of the solder plating film is preferably Sn-3 wt % Ag-0.5 wt % Cu from a point of view for fall impact resistance.

Thickness of the solder plating film is not specifically limited. It is preferable that the thickness thereof (one side) is enough to be 100 μm or less. It may be 20 μm through 50 μm in general. The following will describe, in this embodiment, a case where Cu ball 13 is used as the core material. The Cu ball is plated with Ni so that Ni plating film having a thickness of about 2 μm is formed on a surface of the Cu ball 13. The Ni-plated Cu ball is further plated with the solder plating. Thickness of this solder plating film is about 30 μm. Hereinafter, the ball in which the Cu ball 13 is covered with the solder plating 24 is referred to as "Cu core ball 50" (see FIG. 3A). A diameter of the whole body of Cu core ball 50 is about 265 μm.

When forming the bump electrode 30, this Cu core ball 50 is mounted on the electrode pad 12 of the substrate 11 after the flux 16 has been applied on the electrode pad 12. The substrate 11 is next heated from its normal temperature up to around the liquidus temperature of the solder plating, so that the flux 16 acts as if it removes oxide films from a surface of the Cu core ball 50, which is contacted to the flux 16, and a surface of the electrode pad 12.

In a step where the substrate 11 is further heated following the removal of these oxide films and the solder plating is melted above the liquidus temperature thereof, the creeping up rate of the flux 16 from the electrode pad 12 to a surface of the solder plating 24 of the Cu core ball 50 becomes slower and after the flux 16 creeps up the surface of the solder plating 24 of the Cu core ball 50, accompanying with a removal of the oxide film from the surface of the solder plating 24, the oxide-film-removed portion of the solder plating 24 (solder 14) runs down to the electrode pad 12. On the basis such that the creeping up rate of the flux 16 to the surface of the solder plating 24 of the Cu core ball 50 becomes slower, as described above, a temperature control to heat the substrate 11 is performed in this invention so that running down rate of the solder 14 to the electrode pad 12 becomes slower.

Furthermore, in the specification, the solder plating 24 is referred to as a state of solder material where the Cu core ball 50 is mounted on the electrode pad 12 using the flux 16 and the solder plating 24 of the Cu core ball 50 is then melted by the further heating so that the oxide films are removed from the surfaces by action of the flux 16, when forming the bump electrode 30. The solder 14 is referred to as a state of solder material where the oxide films are removed from the surface of the solder plating 24. Therefore, in the process of forming the bump electrode, during a transition step from the solder plating 24 to the solder 14, there is a state where both of the solder plating 24 and the solder 14 exist together.

In this invention, a Cu core eccentricity control to control the rate of temperature increase to slow down the creep of the flux and remove step by step the oxide film covered on the solder so that the solder gradually runs down is carried out in a solder plating-melting step. Such a Cu core eccentricity control is one example of the core material eccentricity control. According to this Cu core eccentricity control, it is possible to provide the board 100 which has bump electrodes having very small distance between the center of Cu core bump and that of solder resist (see FIG. 2A).

Figure 2A:
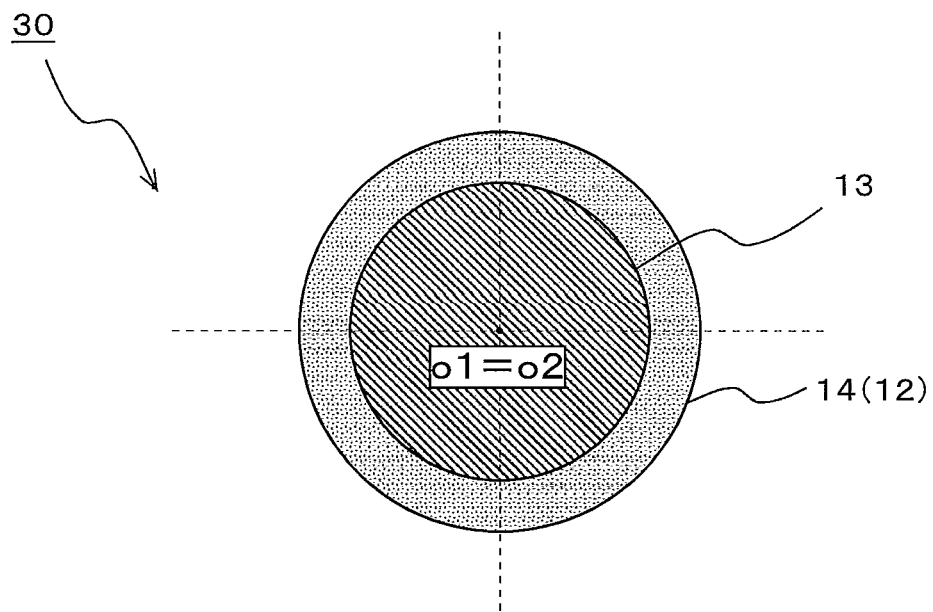
FIG. 2A is a section of a bump electrode, taken along the lines Y-Y in FIG. 1 on a horizontal direction that is parallel with a joined surface of the electrode pad, showing a measurement example of a distance between the center of Cu core bump and that of solder resist when Cu ball is centered.
Figure 2B:
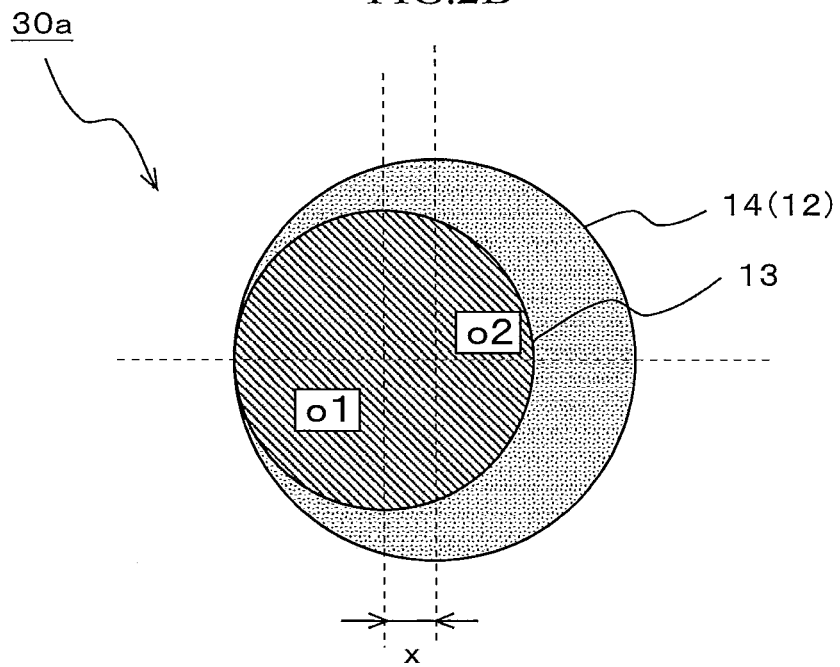
FIG. 2B is a section of a bump electrode, taken along the lines Y-Y in FIG. 1 on the horizontal direction that is parallel with the joined surface of the electrode pad, showing a measurement example of a distance between the center of Cu core bump and that of solder resist when Cu ball is not centered.

The following will describe a method for measuring an amount of the core eccentricity with reference to FIGS. 2A and 2B. These FIGS. 2A and 2B are sections of bump electrodes, each taken along the lines Y-Y in FIG. 1 on a horizontal direction that is parallel with a joined surface of the electrode pad, showing measurement examples of the distance between the center of Cu core bump and that of solder resist.

In FIG. 2A, the bump electrode 30 is configured so that a film of the solder 14 (shell) having even thickness covers a surface of the Cu ball 13. Furthermore, in FIG. 2A, the electrode 12 and the solder 14 are shown so as to be overlapped with each other. In the bump electrode 30, if it is supposed that a section of the core material that becomes the core has a circular shape, when a center of the Cu ball 13 is o1 and a center of the shell of the solder 14 covering the Cu ball 13 is o2, the Cu core eccentricity control allows the center o1 to almost align the center o2. Hereinafter, an interval between the centers o1 and o2 will be indicated as "x". Thus, if X=0, o1=o2. For example, the interval x is obtained by an absolute value of the difference between the centers 01 and o2.

In FIG. 2B, another bump electrode 30a is configured so that a film of the solder 14 covers a surface of the Cu ball 13 but the Cu ball is not centered. The following will describe a mechanism such that an eccentricity of the Cu ball 13 occurs during reflow processing. First, the substrate is heated from its normal temperature up to around the liquidus temperature of the solder plating 24. The flux 16 acts as if it removes oxide film from a surface of the Cu core ball 50, which is contacted to the flux 16, and it also removes oxide film from a surface of the electrode pad 12. Next, in a step of melting the solder plating 24 where the substrate is further heated up to the liquidus temperature thereof or more, the flux 16 creeps up a surface of the solder plating 24 of the Cu core ball 50. When removing the oxide film from the whole surface of the solder plating 24, the solder 14 runs down the Cu ball 13. In this moment, according to a reflow process in which a heating rate of the substrate is set so as to be high, the flux 16 rapidly creeps up the Cu ball 13 and a large amount of the solder 14 runs down at once. It is conceivable that this makes the Cu ball 13 eccentric.

In the bump electrode 30a, a positional shift amount between the center o1 of the Cu ball 13 and the center o2 of the shell of solder 14 is defined as a distance between the center of Cu core bump and that of solder resist. In fact, by polishing the bump electrode 30 on a horizontal direction that was parallel with the substrate 11 after the reflow processing to expose the section thereof, the interval x was measured.

The Cu core eccentricity control has an object to limit the interval x between the centers in all of the bump electrodes below 10 μm. To accomplish the object, the inventors adopt a slower heating process than the conventional heating process in the step of melting the solder plating 24. Accordingly, the melting process is configured so that the creeping up rate of the flux 16 becomes slower, the oxide film covering the solder plating 24 is gradually removed and the solder 14 run down little by little. This melting process allows the Cu ball 13 to be hard to move, which enables a joining electrode in which the bump electrode 30 stays on a center of the electrode pad 12 to be formed even after the reflow processing.

The following will describe forming examples (Part One and Two) of the board 100 which has bump electrodes with reference to FIGS. 3A through 4B. In these examples, the heating rate was set as to be within a range of 0.01° C./sec or more and less than 0.3° C./sec in a step of melting the solder plating 24 in a case of manufacturing the board 100 which has bump electrodes.

Figure 3A:
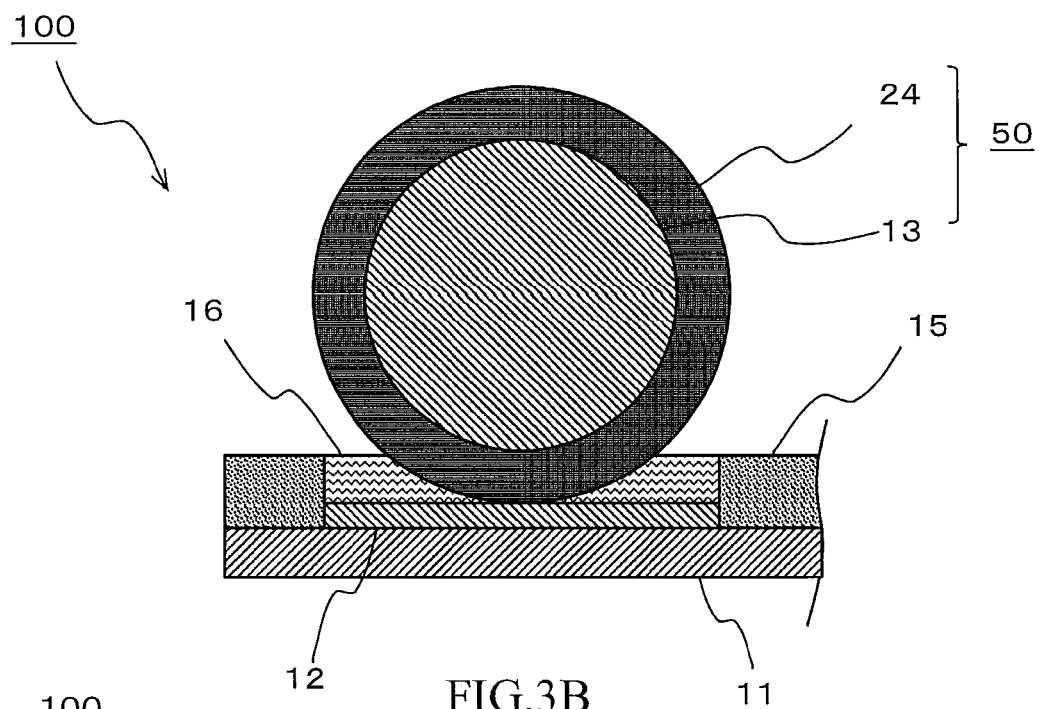
FIG. 3A is a section of the board which has bump electrodes showing a forming example thereof (Part one)
Figure 3B:
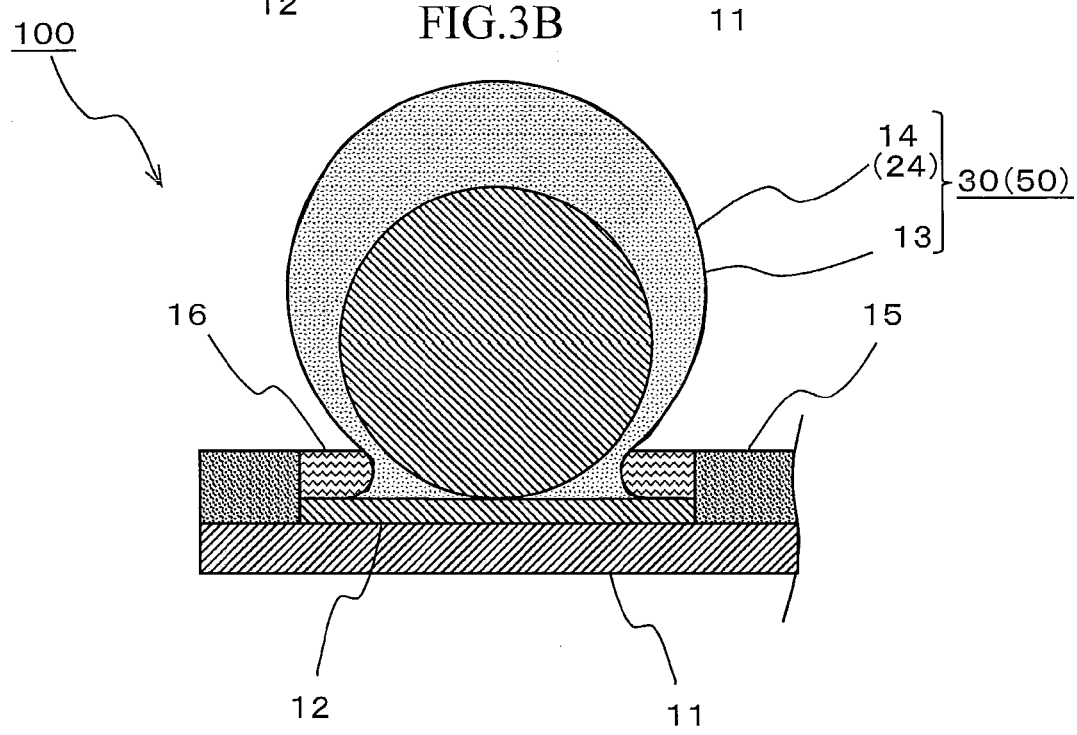
FIG. 3B is a section of the board which has bump electrodes showing the forming example thereof (Part one)

First, as shown in FIG. 3A, after the flux 16 has been applied to the electrode pad 12 of a predetermined substrate 11, the Cu core ball 50 is mounted on the corresponding electrode pad 12. By patterning the circular plane electrodes (land pattern) on the copper layer substrate, the electrode 12 is obtained. The Cu core ball 50 in which the solder plating 24 has previously been applied to the Cu ball 13 is used. In these embodiments and comparison examples, as the core material that becomes the core, the Cu ball 13 having a purity of 99.95% or more of Cu and a diameter of 190 μm is used.

The solder plating 24 is formed by plating the Cu ball that becomes core material with Ni so to have a film thickness of about 2 μm and then, plating it with the solder composed of any metal of at least one of Sn, Ag, Cu, Bi, In, Ni, Sb, Zn, Ge, Ga, Co, Fe, P, Cr, Pb, Fe and Al or their alloy, which has lower liquidus temperature than that of the core material.

In all of the embodiments and comparison examples, the composition of the solder plating 24 was set as to be Sn-3 wt % Ag-0.5 wt % Cu. As the substrate 11, a resin substrate (Opening Diameter: 240 μm, Resist Film Thickness: 15 μm, Surface Treatment: Cu—OSP) was used. When printing the flux, a metal mask was aligned on the substrate on which plural electrode pads were formed and the squeegee was slid on the metal mask so that the flux 14 was applied to the electrode pads through the openings formed in the metal mask.

The substrate 11 was next heated from its normal temperature up to around the liquidus temperature of the solder, so that the oxide films were removed from a surface of the Cu core ball 50 and a surface of the electrode pad 12, which were contacted to the flux 16 (First Melting Step). Temperature conditions of the first melting step was set so that the heating rate (rate of temperature increase) at the heating temperature from the normal temperature to around the liquidus temperature (210° C.) of the solder 14 was, for example, 2.0° C./sec. In the first melting step, the flux 16 removed the oxide films from the electrode pad 12 and a bottom surface side, which was connected to the flux 16, of the Cu core ball 50.

Next, the substrate 11 was further heated following the removal of the oxide films, up to a melting point of the solder plating 24 (Second Melting Step). Temperature conditions of the second melting step was set so that the heating rate at the heating temperature from 210° C. to 230° C. was, for example, within a range of 0.01° C./sec or more and less than 0.3° C./sec. In this moment, the solder plating 24 is melted to transition to the solder 14 so that a self-alignment phenomenon of the Cu core ball 50 and a phenomenon where the Cu ball 13 goes down up to the electrode pad 12 occur (see FIG. 3B). Here, the self-alignment phenomenon is referred to as a phenomenon where the Cu core ball 50 moves to a center of the electrode pad 12 by itself.

In this moment, the oxide film still covers the surface of the Cu core ball 50 but the solder plating 24 starts being melted from an electrode pad side thereof, which has a smaller thermal capacity, toward a Cu ball top side thereof. The solder plating 24 of the bottom shell of the Cu ball 13 is melted right before the start of this melting so that the solder plating 24 transitions to the solder 14 around the contacted portion (base portion) of the Cu ball and the flux to start spreading over. As a result thereof, the Cu ball 13 falls down onto the electrode pad 12. Starting from this condition, the solder plating 24 of the shell is melted on the surface of the Cu ball 13. The solder plating 24 then transitions to the solder 14 inside the Cu ball 13 covered by the oxide film step by step, so that the Cu ball 13 is free from any restriction of the solder plating 24.

Figure 4A:
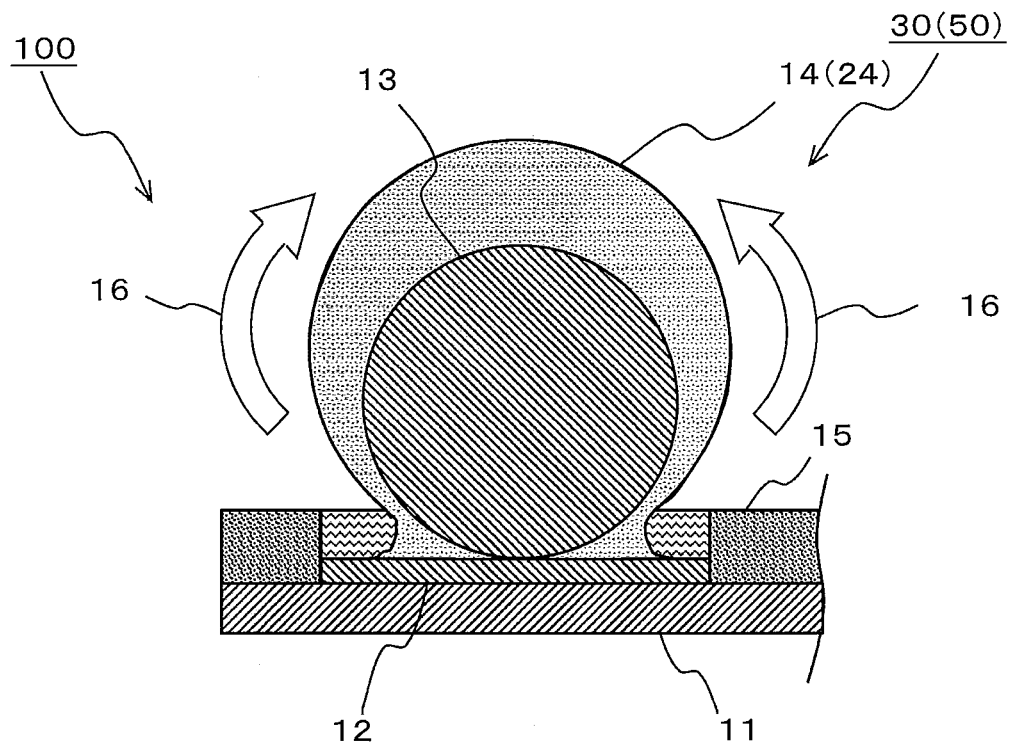
FIG. 4A is a section of the board which has bump electrodes showing a forming example thereof (Part two)

Further, the flux 16 creeps upwards while the flux removes the oxide film from the surface of the solder plating 24 of the Cu core ball 50, as shown in FIG. 4A. In this embodiment, the substrate 11 is heated so that the creeping-up rate of the flux 16 from the electrode pad 12 to the Cu ball 13 as upward void arrows shown in FIG. 4A becomes slower when the transition time to the melting point of the solder plating 24 (Removal Step of Oxide Film).

Figure 4B:
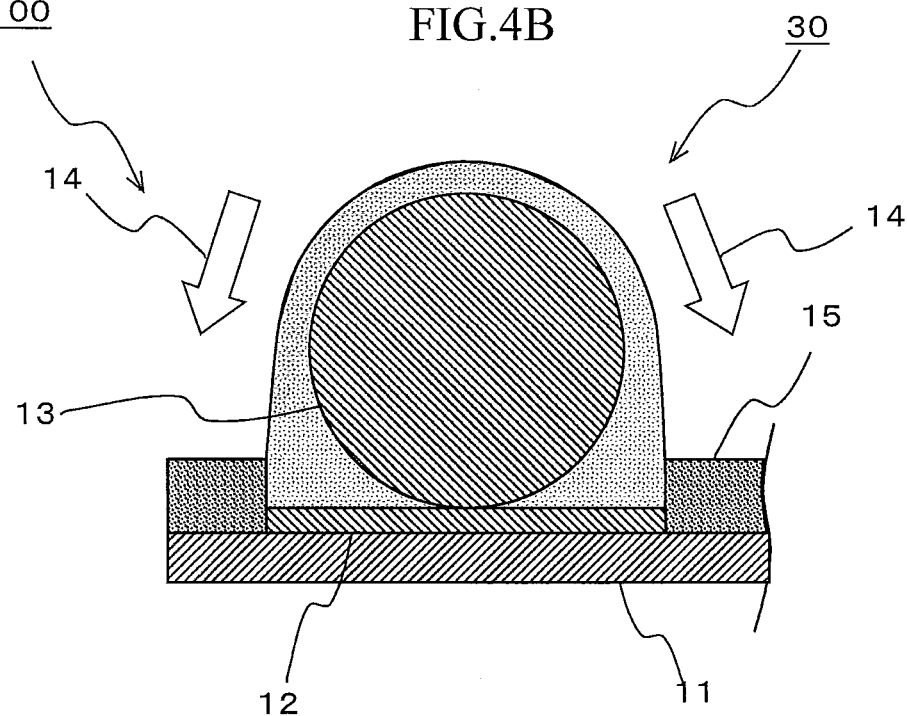
FIG. 4B is a section of the board which has bump electrodes showing the forming example thereof (Part two)

In the melting step of the solder plating 24, as shown in FIG. 4B, the substrate 11 is slowly heated so that the running-down rate of the solder 14 from the Cu ball 13 to the electrode pad 12 as downward void arrows shown in FIG. 4A becomes slower. In the above second melting step, when the oxide film is removed from the whole surface of the Cu core ball 50, the solder 14 falls down from a circumference of the Cu ball 13 to the electrode pad 12 (Cu core eccentricity control).

The following will describe the Cu core eccentricity control with reference to FIGS. 5 through 8. Setting examples of first reflow profile will be illustrated. Two embodiments 1 and 2 will be compared with two comparison examples 1 and 2. The rate of temperature increase as upper limit in which the distance between the center of Cu core bump and that of solder resist is smallest will be studied. In this study, the amounts of Cu core eccentricity were measured on 20 samples and an optimal rate of temperature increase as the upper limit was identified from the relationship between the rate of temperature increase and the distance between the center of Cu core bump and that of solder resist. In these embodiments and the like, a high temperature observation device (SP-5000 DS manufactured by Sanyo Seiko) was utilized in place of a reflow furnace.

In the setting examples under the first reflow profile, the first melting step was set so that as shown in the table of FIG. 5, the rate of temperature increase at the heating temperature from 30° C. (its normal temperature) to 210° C. was 2.0° C./sec. In the first melting step, the same temperature condition was set in every of the embodiments 1 and 2 and the comparison examples 1 and 2.

The second melting step was separately set in the embodiments 1 and 2 and the comparison examples 1 and 2 at the heating temperature from 210° C. to 230° C. The rate of temperature increase was 0.1° C./sec at the embodiment 1. The rate of temperature increase was 0.2° C./sec at the embodiment 2. The rate of temperature increase was 0.3° C./sec at the comparison example 1. The rate of temperature increase was 2.0° C./sec at the comparison example 2.

The third melting step was set so that the rate of temperature increase at the heating temperature from 230° C. to 245° C. when peak temperature for reflow processing was 245° C. was 2.0° C./sec. In the third melting step, the same temperature condition was set in every of the embodiments 1 and 2 and the comparison examples 1 and 2. The cooling step was set in every of the embodiments 1 and 2 and the comparison examples 1 and 2 so that the rate of temperature decrease at the cooling temperature from 245° C. to 180° C. was 2.0° C./sec. Oxygen content in the high temperature observation device was 1000 ppm or less and as the flux 16, WF-6450 (made by Senju Metal Industry) was used.

Figure 6:
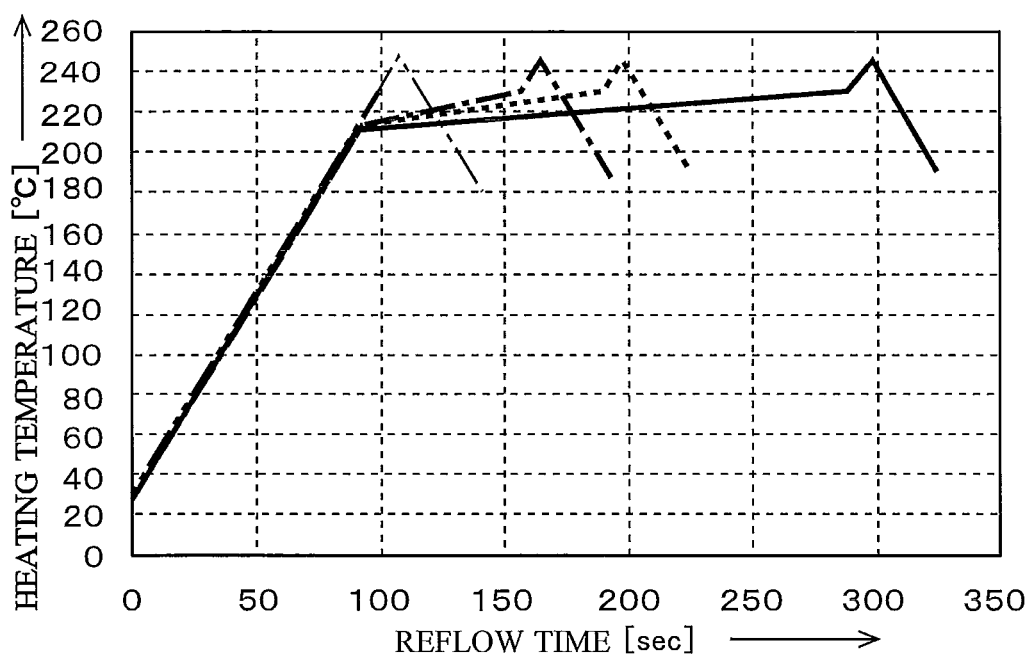
FIG. 6 is a graph showing a first reflow processing example.

The first reflow processing examples shown in FIG. 6 were carried out under the first reflow profile. The vertical axis indicates heating temperature (° C.) in the high temperature observation device. The horizontal axis indicates reflow time (sec) of the substrate 11. A solid thick line shown in the FIG. 6 shows the embodiment 1 in which the rate of temperature increase at the heating temperature from 210° C. to 230° C. is 0.1° C./sec. A dotted thick line shown in the FIG. 6 shows the embodiment 2 in which the rate of temperature increase at the heating temperature from 210° C. to 230° C. is 0.2° C./sec. An alternate long and short dash thick line shown in the FIG. 6 shows the comparison example 1 in which the rate of temperature increase at the heating temperature from 210° C. to 230° C. is 0.3° C./sec. Two dot chain thin line shown in the FIG. 6 shows the comparison example 2 in which the rate of temperature increase at the heating temperature from 210° C. to 230° C. is 2.0° C./sec.

Figure 7A:
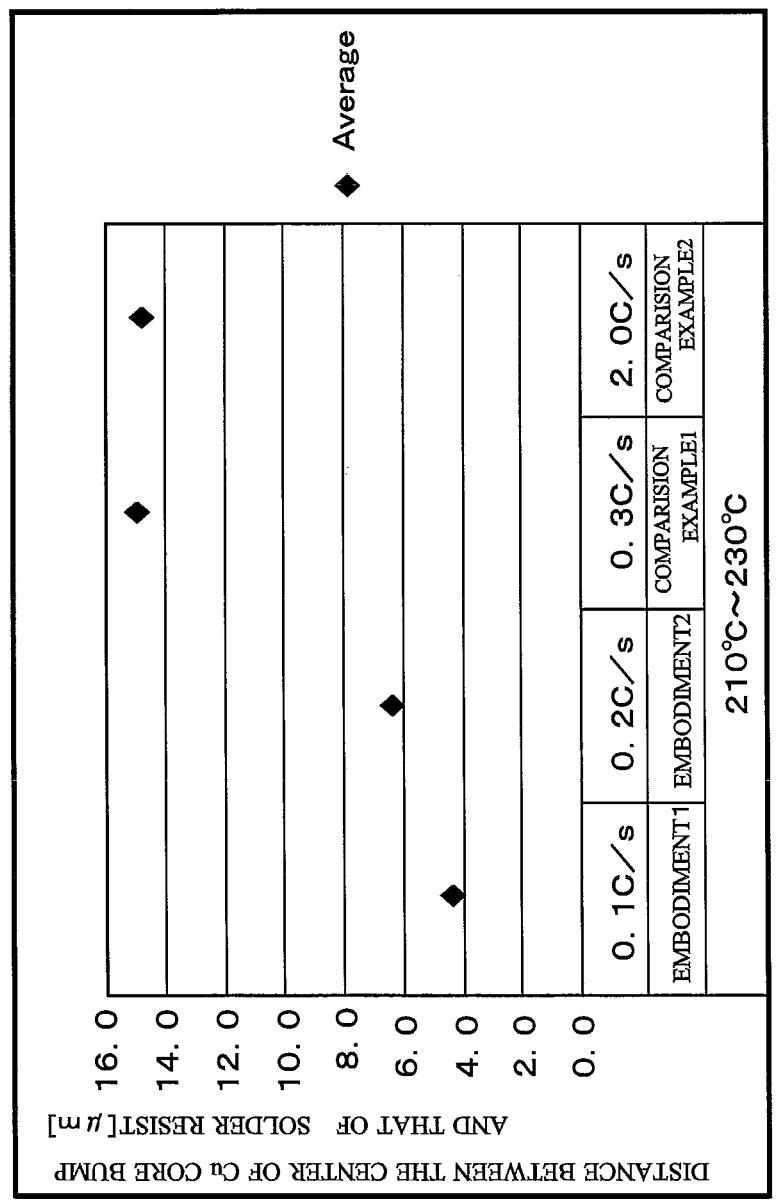
FIG. 7A is a graph showing a distribution example of the distance between the center of Cu core bump and that of solder resist against rate of temperature increase in the first reflow profile.

FIG. 7A shows a distribution example of the distance between the center of Cu core bump and that of solder resist against the rate of temperature increase in the first reflow profile. The vertical axis indicates the distance between the center of Cu core bump and that of solder resist ($\mu$m) at the heating temperature from 210° C. to 230° C. The horizontal axis indicates the rate of temperature increase (° C./sec: which is indicated as C/s in FIG. 7A) in the Embodiments 1 and 2 and the comparison examples 1 and 2. Black diamond marks shown in FIG. 7A indicate averages of the distance between the center of Cu core bump and that of solder resist.

In these first reflow processing examples, the intervals x between the center o1 of each Cu ball 13 and the center o2 of each shell on 20 samples were measured by polishing the bump electrodes 30 on a horizontal direction that was parallel with the substrate 11 after the reflow processing to expose the sections thereof. In the embodiment 1, the amounts of Cu core eccentricity distributed around 4.4 $\mu$m as an average of those of the 20 samples. In the embodiment 2, the amounts of Cu core eccentricity distributed around 6.3 $\mu$m as an average thereof. In the comparison example 1, the amounts of Cu core eccentricity distributed around 15.0 $\mu$m as an average thereof. In the comparison example 2, the amounts of Cu core eccentricity distributed around 14.8 $\mu$m as an average thereof.

FIG. 7B shows the table indicating these relationships. It is understood from the table that the substrate may be heated at the rate of temperature increase of less than 0.3° C./sec in order to make the distance between the center of Cu core bump and that of solder resist limited.

Figure 8:
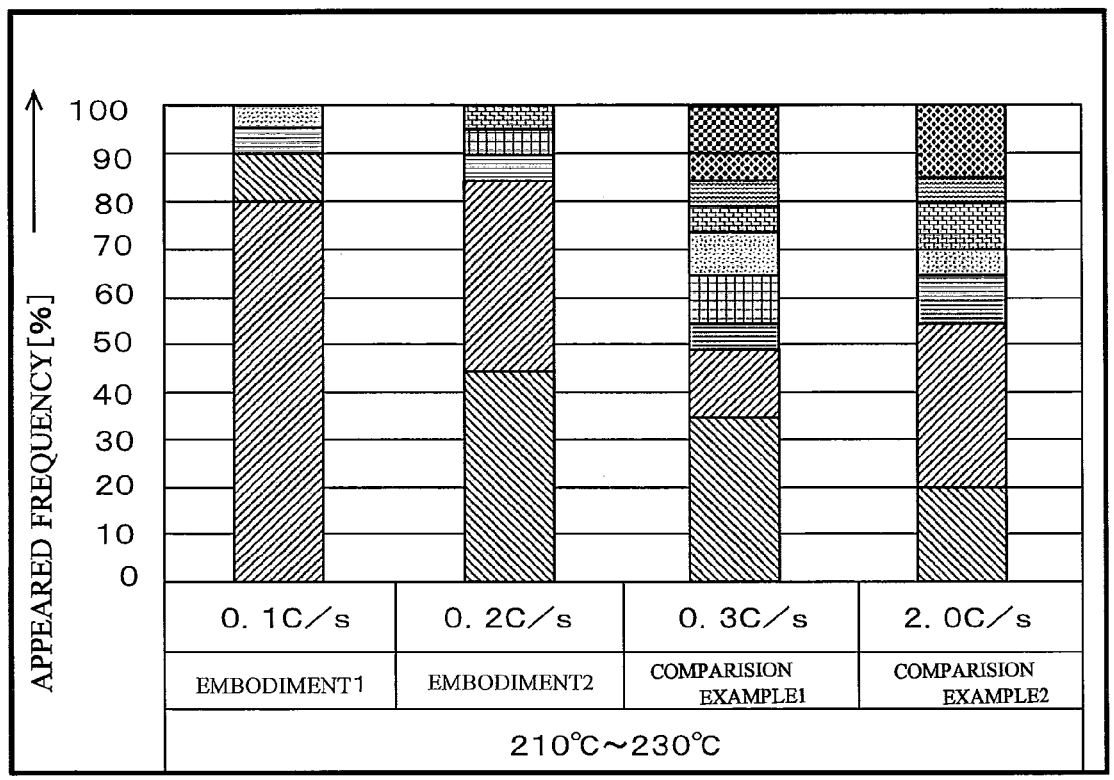
FIG. 8 is a graph showing appeared frequency examples of the distance between the center of Cu core bump and that of solder resist against the rate of temperature increase in the first reflow profile.
Figure 8:
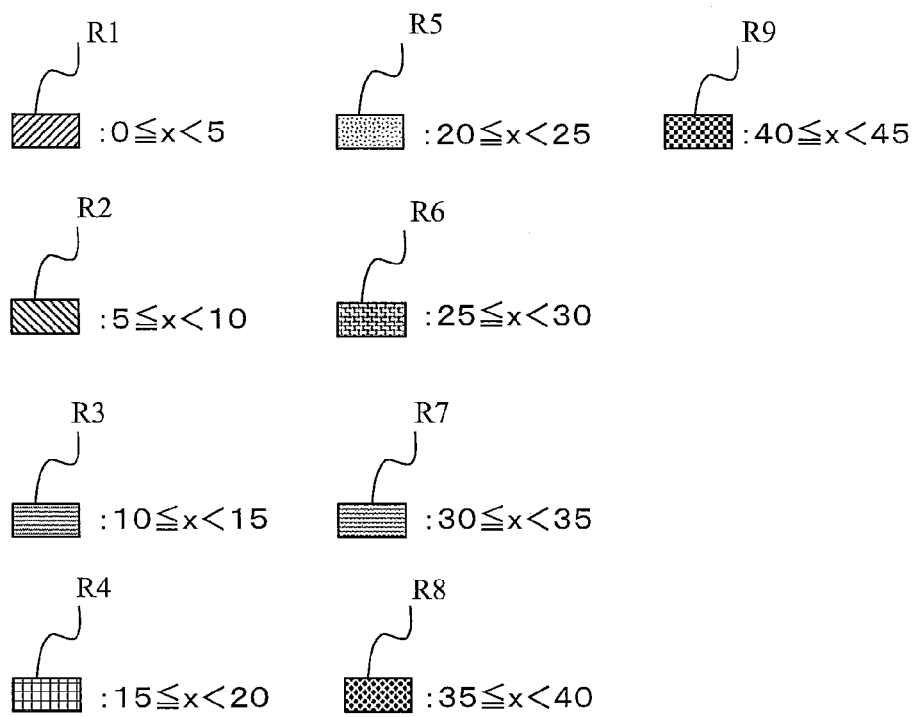

FIG. 8 shows observed frequency examples of the Cu core eccentricity against the rate of temperature increase in the first reflow profile. The vertical axis indicates observed frequency of the Cu core eccentricity, which is a probability, in that a frequency in which the Cu core eccentricity could be observed in 20 samples at the heating temperature from 210° C. to 230° C. is indicated by a percentage. The horizontal axis indicates the rate of temperature increase (° C./sec: which is indicated as C/s in FIG. 8) in the Embodiments 1 and 2 and the comparison examples 1 and 2.

In FIG. 8, a range R1 indicates that the interval x is within a range of $0 \leq x < 5$ $\mu$m. A range R2 indicates that the interval x is within a range of $5 \leq x < 10$ $\mu$m. A range R3 indicates that the interval x is within a range of $10 \leq x < 15$ $\mu$m. A range R4 indicates that the interval x is within a range of $15 \leq x < 20$ $\mu$m. A range R5 indicates that the interval x is within a range of $20 \leq x < 25$ $\mu$m. A range R6 indicates that the interval x is within a range of $25 \leq x < 30$ $\mu$m. A range R7 indicates that the interval x is within a range of $30 \leq x < 35$ $\mu$m. A range R8 indicates that the interval x is within a range of $35 \leq x < 40$ $\mu$m. A range R9 indicates that the interval x is within a range of $40 \leq x < 45$ $\mu$m.

In the embodiment 1 (the rate of temperature increase of 0.1° C./sec), the range R1 of $0 \leq x < 5$ $\mu$m occupied 80% of these 20 samples. The ranges R1 and R2 of 0≤x<10 µm occupied 90% of these 20 samples. In the embodiment 2 (the rate of temperature increase of 0.2° C./sec), the range R1 of 0≤x<5 µm occupied 45% of these 20 samples. The ranges R1 and R2 of 0≤x<10 µm occupied 85% of these 20 samples. In the comparison example 1 (the rate of temperature increase of 0.3° C./sec), the range R1 of 0≤x<5 µm occupied 35% of these 20 samples. The ranges R1 and R2 of 0≤x<10 µm merely occupied 48% of these 20 samples. In the comparison example 2 (the rate of temperature increase of 2.0° C./sec), the range R1 of 0≤x<5 µm occupied 20% of these 20 samples. The ranges R1 and R2 of 0≤x<10 µm merely occupied 55% of these 20 samples.

Accordingly, according to the Cu core eccentricity control at the heating temperature from 210° C. to 230° C., it is understood that the upper limit of the rate of temperature increase in order to almost accomplish the object to limit the interval x between the centers o1 and o2 below 10 µm in the bump electrode 30 may be set to be less than 0.3° C./sec.

The following will describe the Cu core eccentricity control with reference to FIGS. 9 through 12. Setting examples of second reflow profile will be illustrated. Six embodiments 3 through 8 will be compared with one comparison example 3. The rate of temperature increase as lower limit in which the distance between the center of Cu core bump and that of solder resist is smallest will be studied. In this study, the amounts of Cu core eccentricity were also measured on 20 samples and an optimal rate of temperature increase as the lower limit was identified from the relationship between the rate of temperature increase and the distance between the center of Cu core bump and that of solder resist.

In the setting examples under the second reflow profile, the first melting step was set so that as shown in the table of FIG. 9, the rate of temperature increase at the heating temperature from 30° C. (its normal temperature) to 215° C. was 2.0° C./sec. In the first melting step, the same temperature condition was set in every of the embodiments 3 through 8 and the comparison example 3.

The second melting step was separately set in the embodiments 3 through 8 and the comparison example 3 at the heating temperature from 210° C. to 230° C. The rate of temperature increase was set to be 0.01° C./sec at the embodiment 3. The rate of temperature increase was set to be 0.05° C./sec at the embodiment 4. The rate of temperature increase was set to be 0.10° C./sec at the embodiment 5. The rate of temperature increase was set to be 0.13° C./sec at the embodiment 6. The rate of temperature increase was set to be 0.15° C./sec at the embodiment 7. The rate of temperature increase was set to be 0.20° C./sec at the embodiment 8. The rate of temperature increase was 2.0° C./sec at the comparison example 3.

The third melting step was set so that the rate of temperature increase at the heating temperature from 228° C. to 245° C. when peak temperature for reflow processing was 245° C. was 2.0° C./sec. In the third melting step, the same temperature condition was set in every of the embodiments 3 through 8 and the comparison example 3. The cooling step was set in every of the embodiments 3 through 8 and the comparison example 3 so that the rate of temperature decrease at the cooling temperature from 245° C. to 180° C. was 2.0° C./sec, which was similar to the embodiments 1 and 2 and the comparison examples 1 and 2. Oxygen content in the high temperature observation device was 1000 ppm or less and as the flux 16, WF-6450 was used.

Figure 10:
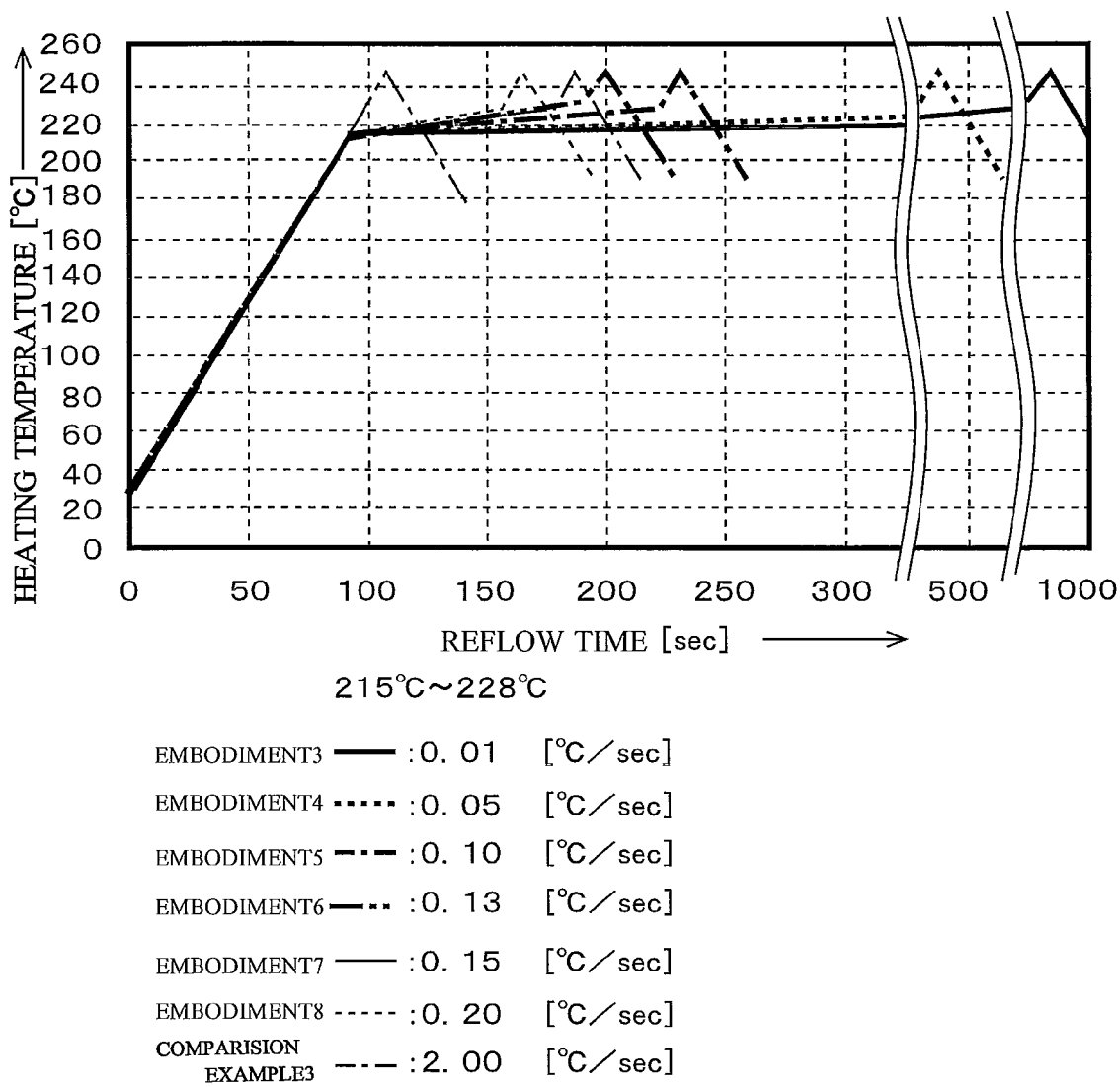
FIG. 10 is a graph showing a second reflow processing example.

The second reflow processing examples shown in FIG. 10 were carried out under the second reflow profile. The vertical axis indicates heating temperature (° C.) in the high temperature observation device. The horizontal axis indicates reflow time (sec) of the substrate 11. A solid thick line shown in the FIG. 10 shows the embodiment 3 in which the rate of temperature increase at the heating temperature from 215° C. to 228° C. is 0.01° C./sec. A dotted thick line shown in the FIG. 10 shows the embodiment 4 in which the rate of temperature increase at the heating temperature from 215° C. to 228° C. is 0.05° C./sec. An alternate long and short dash thick line shown in the FIG. 10 shows the embodiment 5 in which the rate of temperature increase at the heating temperature from 215° C. to 228° C. is 0.10° C./sec. Two dot chain thick line shown in the FIG. 10 shows the embodiment 6 in which the rate of temperature increase at the heating temperature from 215° C. to 228° C. is 0.13° C./sec. A solid thin line shown in the FIG. 10 shows the embodiment 7 in which the rate of temperature increase at the heating temperature from 215° C. to 228° C. is 0.15° C./sec. A dotted thin line shown in the FIG. 10 shows the embodiment 8 in which the rate of temperature increase at the heating temperature from 215° C. to 228° C. is 0.20° C./sec. An alternate long and short dash thin line shown in the FIG. 10 shows the comparison example 3 in which the rate of temperature increase at the heating temperature from 215° C. to 228° C. is 2.0° C./sec.

In the Cu core eccentricity control according to this invention, the amount of the Cu core eccentricity was controlled by lowering the rate of temperature increase within a range of plus or minus 10 degrees of the solder melting point. Further, it was defined that a narrower region in which the rate of temperature increase was lowered was preferable because when requiring a lot of the reflow time, joining reliability was deteriorated by a growth of IMC, the flux 16 was deactivated and/or the oxide film of the bump electrode augmented.

Figure 11A:
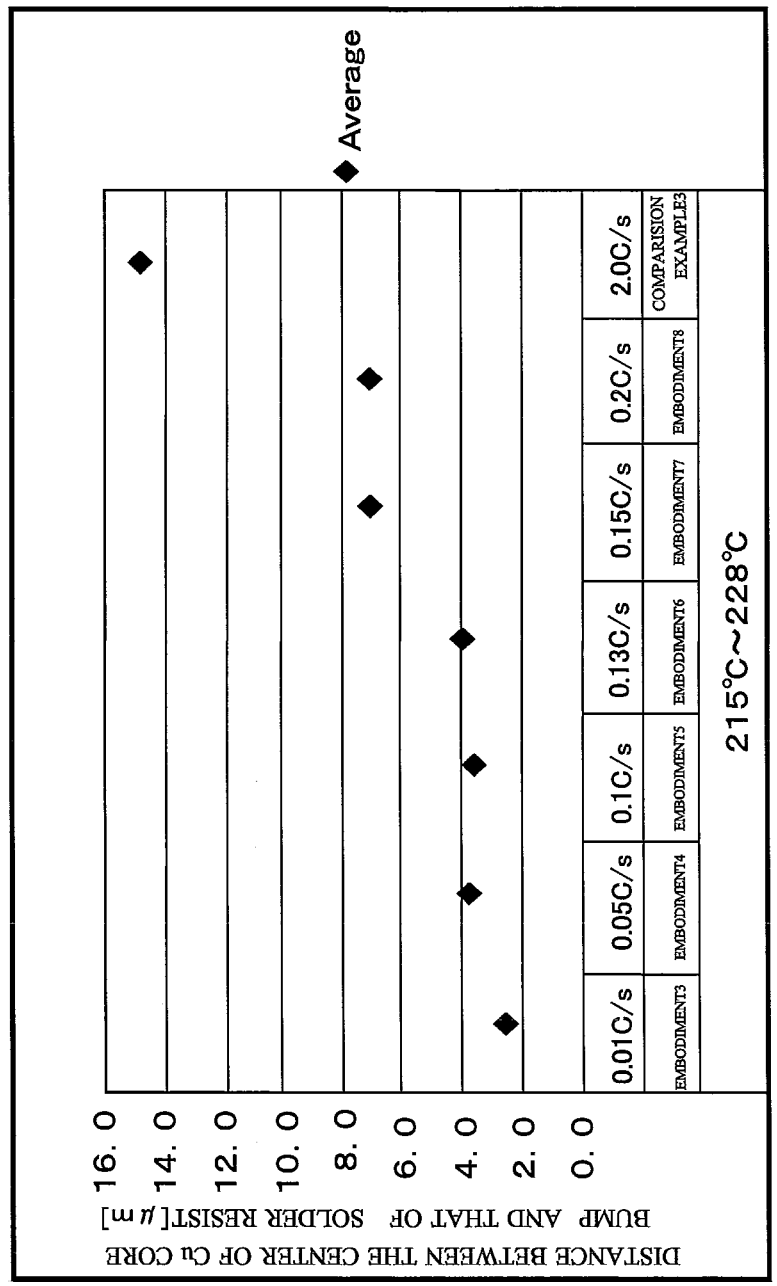
FIG. 11A is a graph showing a distribution example of the distance between the center of Cu core bump and that of solder resist against the rate of temperature increase in the second reflow profile.

FIG. 11A shows a distribution example of the distance between the center of Cu core bump and that of solder resist against the rate of temperature increase in the second reflow profile. The vertical axis indicates the distance between the center of Cu core bump and that of solder resist (µm) at the heating temperature from 215° C. to 228° C. The horizontal axis indicates the rate of temperature increase (° C./sec: which is indicated as C/s in FIG. 11A) in the Embodiments 3 through 8 and the comparison example 3.

In these second reflow processing examples, the intervals x between the center o1 of each Cu ball 13 and the center o2 of each shell on 20 samples were also measured by polishing the bump electrodes 30 on a horizontal direction that was parallel with the substrate 11 after the reflow processing to expose the sections thereof (see the sections shown in FIGS. 2A and 2B). In the embodiment 3, the amounts of Cu core eccentricity distributed around 2.5 µm as an average of those of the 20 samples. In the embodiment 4, the amounts of Cu core eccentricity distributed around 3.9 µm as an average thereof. In the embodiment 5, the amounts of Cu core eccentricity distributed around 3.6 µm as an average thereof. In the embodiment 6, the amounts of Cu core eccentricity distributed around 4.0 µm as an average thereof. In the embodiment 7, the amounts of Cu core eccentricity distributed around 6.8 µm as an average thereof. In the embodiment 8, the amounts of Cu core eccentricity distributed around 7.3 µm as an average thereof. In the comparison example 3, the amounts of Cu core eccentricity distributed around 14.8 µm as an average thereof.

FIG. 11B shows the table indicating these relationships. It is understood from the table that the heating at the rate of temperature increase of less than 0.3° C./sec may be performed in order to make the distance between the center of Cu core bump and that of solder resist limited.

Figure 12:
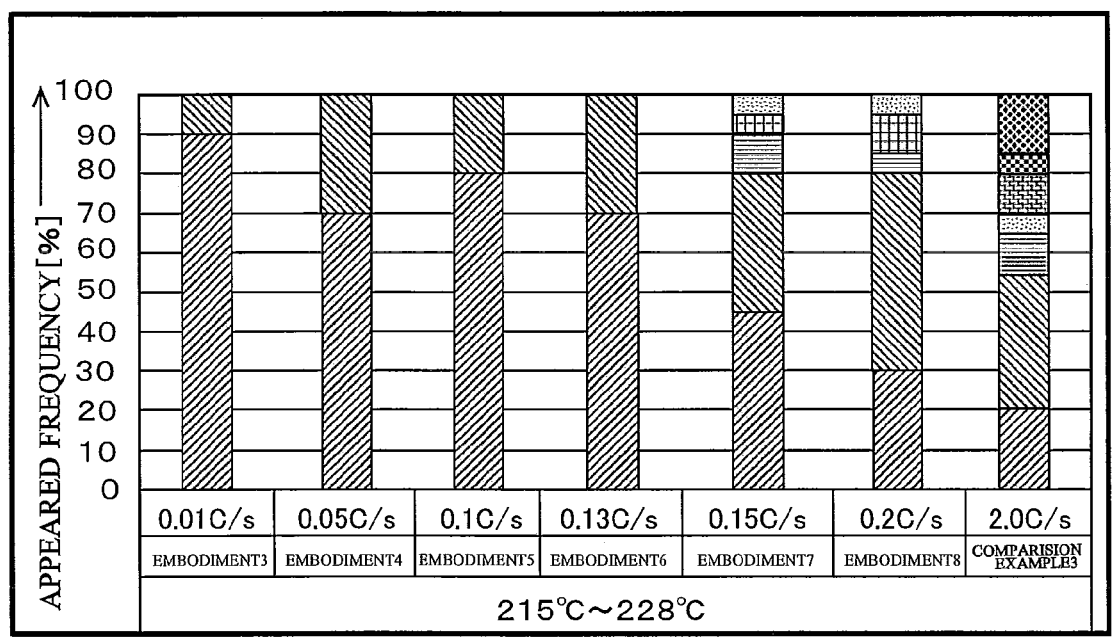
FIG. 12 is a graph showing appeared frequency examples of the distance between the center of Cu core bump and that of solder resist against the rate of temperature increase in the second reflow profile.

FIG. 12 shows appeared frequency examples of the Cu core eccentricity against the rate of temperature increase in the second reflow profile. The vertical axis indicates appeared frequency of the Cu core eccentricity, which is a probability, in that a frequency in which the Cu core eccentricity could be appeared in 20 samples at the heating temperature from 215° C. to 228° C. is indicated by a percentage. The horizontal axis indicates the rate of temperature increase (° C./sec: which is indicated as C/s in FIG. 12) in the Embodiments 3 through 8 and the comparison example 3.

In FIG. 12, ranges R1 through R9 indicate the same conditions as those of the ranges R1 through R9 shown in FIG. 8, the description of which will be omitted.

In the embodiment 3 (the rate of temperature increase of 0.01° C./sec), the range R1 of 0≤x<5 μm occupied 90% of these 20 samples. The ranges R1 and R2 of 0≤x<10 μm occupied 100% of these 20 samples. In the embodiment 4 (the rate of temperature increase of 0.05° C./sec), the range R1 of 0≤x<5 μm occupied 70% of these 20 samples. The ranges R1 and R2 of 0≤x<10 μm occupied 100% of these 20 samples. In the embodiment 5 (the rate of temperature increase of 0.10° C./sec), the range R1 of 0≤x<5 μm occupied 80% of these 20 samples. The ranges R1 and R2 of 0≤x<10 μm occupied 100% of these 20 samples. In the embodiment 6 (the rate of temperature increase of 0.13° C./sec), the range R1 of 0≤x<5 μm occupied 70% of these 20 samples. The ranges R1 and R2 of 0≤x<10 μm occupied 100% of these 20 samples. In the embodiment 7 (the rate of temperature increase of 0.15° C./sec), the range R1 of 0≤x<5 μm occupied 45% of these 20 samples. The ranges R1 and R2 of 0≤x<10 μm occupied 80% of these 20 samples. In the embodiment 8 (the rate of temperature increase of 0.2° C./sec), the range R1 of 0≤x<5 μm occupied 30% of these 20 samples. The ranges R1 and R2 of 0≤x<10 μm occupied 80% of these 20 samples.

On the other hand, in the comparison example 3 (the rate of temperature increase of 2.0° C./sec), the range R1 of 0≤x<5 μm occupied 20% of these 20 samples. The ranges R1 and R2 of 0≤x<10 μm merely occupied 55% of these 20 samples.

In the above-mentioned Cu core eccentricity control at the heating temperature from 215° C. to 228° C., the ranges R1 and R2 of 0≤x<10 μm in the amounts of the Cu core eccentricity occupied 100% of these 20 samples below the rate of temperature increase of 0.13° C./sec. Accordingly, it is understood that the rate of temperature increase around the solder melting point would be effective to the Cu core eccentricity control after the reflow processing. Thus, it is understood that the lower limit of the rate of temperature increase in order to almost accomplish the object to limit the interval x between the centers o1 and o2 below 10 μm in the bump electrode 30 may be set to be 0.01° C./sec, from the point of view that this is a critical reflow time to be industrially available without any risk of deterioration on the joining reliability based on a growth of IMC.

By the bump electrode 30 and the board 100 which has bump electrodes according to the embodiments, it is possible to control the eccentricity of the Cu ball 13 when its heating rate is set as to be within a range of 0.01° C./sec or more and less than 0.3° C./sec regardless of any heating temperature. In this eccentricity control of the Cu ball 13, the substrate 11 is heated so that the creeping up rate of the flux 16 from the electrode pad 12 becomes slower and the falling-down rate of the solder 14 to the electrode pad 12 becomes slower, and then the solder 14 is melted around the Cu ball 13.

Based on such a configuration, it is possible to provide the board 100 which has bump electrodes. The board 100 has an excellent reliability in which the center of the Cu ball 13, which is the core material that becomes the core, aligns the center of the shell of the solder 14 on the electrode pad 12 in the horizontal section.

In the method for manufacturing the board 100 which has bump electrodes according to the embodiments, during the melting step of the solder plating 24 after the oxide films have been removed from the electrode pad 12 and the Cu ball 13, the substrate 11 is heated so that the creeping up rate of the flux 16 from the electrode pad 12 to the Cu ball 13 becomes slower and the falling-down rate of the solder 14 from the Cu ball 13 to the electrode pad 12 becomes slower.

Based on such a configuration, it is possible to provide a process such that the creeping up of the flux 16 is slow, the oxide film covering the solder plating 24 is gradually removed and the solder 14 falls down little by little. Accordingly, it is possible to cover the surface of the Cu ball 13 with the shell of the solder 14 having even thickness, which allow the Cu ball 13 to be hard to move. After the heating treatment is performed, it is thus possible to provide the bump electrode 30 in which the center of the Cu ball 13 aligns the center of the shell of the solder 14 on a center of the electrode pad 12.

It should be understood by those skilled in the art that various modifications, combinations, sub-combinations and alterations may occur depending on design requirements and other factors insofar as they are within the scope of the appended claims or the equivalents thereof.

Further, it is possible to align the center of the Cu bail 13 with the center of the shell of the solder 14 after the reflow processing regardless of conditions of 0.05≤(Vs/Vc)≤0.5 wherein Vc is volume of the Cu ball and Vs is volume of solder plated layer and 0.5≤(Dp/Dc)≤1.0 wherein Dp is a diameter of the electrode pad 12 and Dc is a diameter of the Cu ball, as the conventional case.

Although a case where the flux 16 is applied to the electrode pad 12 has been described in the above embodiments, the invention is not limited thereto. For example, a solder paste may be used in place of the flux 16.

The invention may be applied to a bump electrode that is available for BGA, which is a package of surface mounting type for IC chips, a board which has bump electrodes and a method for manufacturing the board which has bump electrodes.

What is claimed is:
1. A method for making a bump electrode on an electrode pad, the bump electrode being made from a core ball covered with solder plating, comprising the steps of:
providing an electrode pad;
mounting the core ball covered with solder plating on the electrode pad; and
heating the electrode pad and thereby melting the solder plating in a reflow process wherein a heating rate is such as to raise a temperature of the electrode pad during the reflow process not less than 0.01 degrees C./second and less than 0.3 degrees C./second in the heating and melting step while heating in the temperature range from 210° C. to 230° C.

2. A method for manufacturing a board which has a bump electrode, the method comprising the steps of:
providing an electrode pad on a substrate;

mounting a connecting member, the connecting member including a core ball covered with solder plating, on the electrode pad; and heating the substrate and thereby melting the solder plating with which the core ball is covered, while controlling a rate of heating the substrate and thereby raising the temperature of the electrode pad during a reflow process by not less than 0.01° C./sec but less than 0.3° C./sec in the step of melting the solder plating while heating in the temperature range from 210° C. to 230° C.).

* * * * *